United States Patent [19]

Wei

[11] Patent Number: 5,250,394
[45] Date of Patent: Oct. 5, 1993

[54] METALLIZATION METHOD FOR MICROWAVE CIRCUIT

[75] Inventor: Shih-Long Wei, Hsinchu, Taiwan

[73] Assignee: Industrial Technology Research Institute, Hsinchu, Taiwan

[21] Appl. No.: 823,351

[22] Filed: Jan. 21, 1992

[51] Int. Cl.⁵ .............................................. H05K 3/02
[52] U.S. Cl. ..................................... 430/313; 430/311; 430/318; 156/89; 156/625; 428/209; 428/901
[58] Field of Search ............... 430/198, 311, 313, 314, 430/318, 329; 156/89, 625, 659.1, 660; 428/209, 210, 320.2, 901

[56] References Cited

U.S. PATENT DOCUMENTS

| | | | |
|---|---|---|---|
| 4,373,019 | 2/1983 | Watanabe | 430/313 |
| 4,748,742 | 6/1988 | Choinski | 29/846 |
| 4,835,038 | 5/1989 | Kaneko | 156/89 |

OTHER PUBLICATIONS

Rose "Thin Film Circuit Manufacturing Using Thick Film Technology" Hybrid Circuit Technology, Mar. 1990, pp. 48-49.

Primary Examiner—Marion E. McCamish
Assistant Examiner—Kathleen Duda
Attorney, Agent, or Firm—George O. Saile

[57] ABSTRACT

The method involves a thick film paste that is screen printed over the circuit plane of the substrate in the desired circuit pattern. The thick film paste is dried and fired. A metalorganic conductive paste is screen printed on top of the thick film circuit pattern, then it is dried and fired. If the printed circuit covers the whole substrate, the metalorganic paste is screen printed over the whole substrate. Alternatively, if the printed circuit covers portions of the substrate, the metalorganic paste is screen printed only over those portions. If the linewidth of the desired circuits is less than 4 mils, then the circuits are defined by photolithography. Alternatively, if the desired linewidth is greater than 4 mils, the screen printing technology is sufficient to define the circuits.

17 Claims, 1 Drawing Sheet

METALLIZATION METHOD FOR MICROWAVE CIRCUIT

BACKGROUND OF THE INVENTION (1) Field of the Invention

This invention relates to the fabrication of integrated circuit devices and more particularly to methods of metallizing substrates which are then useful as microwave circuits.

(2) Description of the Prior Art

Thick film processing for microwave circuits is desirable because of the low equipment and production costs, lower electrical line resistance, and good adhesion between the conductor and the substrate.

The disadvantages of this method are a larger conductor structure size (smallest clearance and conductor width is 100 to 125 microns with an edge accuracy of 20 to 30 microns due to screen mesh size), larger surface roughness, poor thickness uniformity, higher electrical transmission loss, and lower circuit density.

The advantages of thin film processing are a smaller conductor size (clearance and conductor width is less than 10 microns with an edge accuracy of less than 1 micron), good surface roughness, lower electrical transmission loss, good thickness uniformity, and higher circuit density.

Thin film processing requires a higher investment in equipment, higher production costs, lower production rates, higher electrical line resistance, and poor adhesion between conductor and substrate.

A. Rose in "Thin Film Circuit Manufacturing using Thick Film Technology" in Hybrid Circuit Technology March, 1990 pp. 48–49 points out that the metallorganic material allows the fabrication of thin film circuits by print-and-fire technology for they leave an extremely smooth thin film on the substrate after printed and fired. Unfortunately, they can not be printed (or need to repeat many times) to an acceptable thickness. For example, if there is needed a layer of 10 micrometers in thickness and a resulting thin film after single application and firing only typically leaves a thickness of 0.3 to 0.6 micrometers, there would have to be 20 or more applications and firings to obtain a total layer thickness of 10 micrometers.

Another solution is plating the screen printed metallorganic layer. However, there are many disadvantages to this course which include high cost, complex process, more contamination problems and the plating solution must be either acid or alkaline, so there will be damage to the screen printed metallorganic material and degradation to its adhesion to the substrate.

Some of the prior technology is shown in U.S. Pat. No. 4,710,395 to W. M. Young et al wherein a vacuum table is used to pull the conductor material into the through holes. U.S. Pat. No. 4,416,932 to K. M. Nair describes a noble metal thick film composition with glass for sintering to form lines on a ceramic substrate. U.S. Pat. No. 4,748,742 to E. J. Choinski shows a vacuum table to pull material into and through the holes in the circuit board using significantly different materials than the present invention.

SUMMARY OF THE INVENTION

A principal object of the invention is to provide an effective and very manufacturable method to metallize a microwave integrated circuit.

This invention comprises a combination of conventional thick film processing with a metallorganic conductive layer. The method of this invention combines the advantages of both thick and thin film processing with none of the disadvantages of the separately used technologies.

In accordance with the object of this invention, a new method of metallizing a microwave circuit is achieved. The method involves a thick film is screen printed over the circuit plane of the substrate in the desired circuit pattern. The thick film is dried and fired. A metallorganic conductive paste is screen printed on top of the thick film circuit pattern, then it is dried and fired.

If the printed circuit covers the whole substrate, the metallorganic paste is screen printed over the whole substrate. Alternatively, if the printed circuit covers portions of the substrate, the metallorganic paste is screen printed only over those portions. If the linewidth of the desired circuits is less than 4 mils, then the circuits are defined by photolithography. Alternatively, if the desired linewidth is greater than 4 mils, the screen printing technology is sufficient to define the circuits.

A ground plane on the opposite side of the printed circuit may also be provided. Using this option, through-holes are appropriately formed in the substrate before the beginning of the circuit side pattern formation. A screen printing of the ground plane thick film paste layer is done. The substrate is placed on a vacuum table and the thick film is pulled through the through-holes or via holes by means of a vacuum pumping action. The ground plane thick film is dried, but not fired. Now the circuit pattern of thick film and thin film as described above is formed.

BRIEF DESCRIPTION OF THE DRAWINGS

In the accompanying drawings forming a material part of this description, there is shown.

DESCRIPTION OF THE PREFERRED EMBODIMENTS

Figure 1:
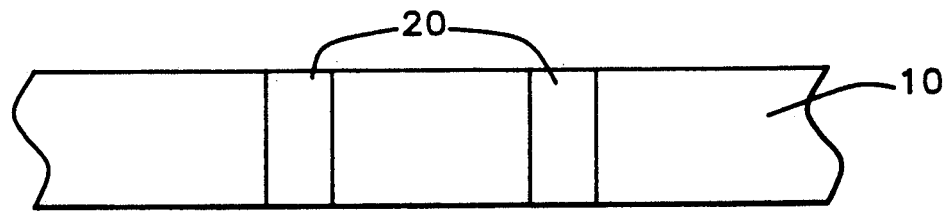
FIGS. 1 through 4 schematically illustrate in cross-sectional representation one preferred embodiment of this invention.

Referring now more particularly to FIG. 1, there is shown a substrate 10, which may be composed of a ceramic material through which via holes 20 have been formed. Laser-drilling is a preferred way of forming these via holes. The particular ceramic substrate can be alumina, alumina nitride, beryllium oxide, silicon carbide or the like which in part is based upon the requirements of the microwave circuit.

Figure 2:
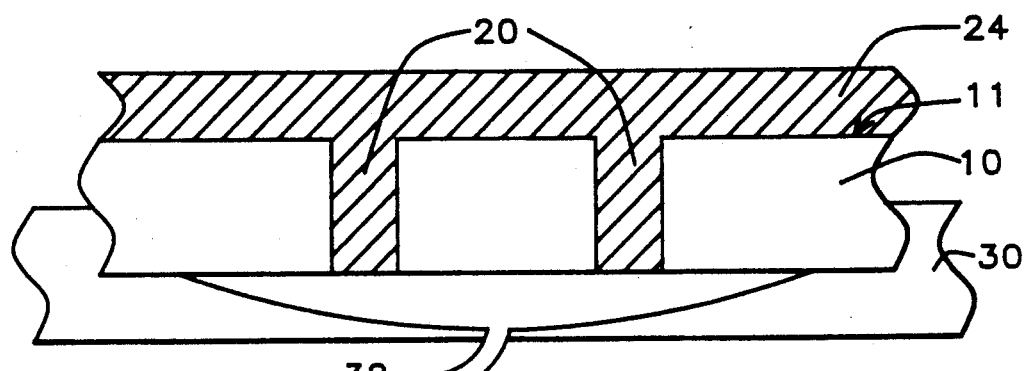

Referring now to FIG. 2, a thick film paste 24 is screen printed over the ground plane 11 of the ceramic substrate 10. The thick film paste 24 may be composed of gold, copper, silver or other high conductivity powders; glass frit and/or metal oxides; and suitable nonvolatile resin and volatile solvent or vehicle. These described materials of the thick film conductor paste consist of three main phases, (1) a conductive phase, (2) a permanent binder phase and (3) an organic vehicle. The conductive phase consist of finely divided precious metal powders. The metal powders used in the conductors are usually prepared by precipitation from aqueous solution. Permanent binder phase of thick film conductor paste determines the adhesion of the conductor to the substrate and also has a significant effect of other conductor properties. These permanent binder materials may be glass, metal oxide or a mixture of glass and metal oxide. Glasses, such as those with lead-bismuthsilicate or lead borosilicate chemistry wet the substrate, creating a mechanical bond to the substrate during firing. Oxides, such as Cu&O or PdO often are added to form chemical or reactive bonds with the substrate. The vehicle typically contains two components, a volatile solvent and a nonvolatile organic resin. The vehicle acts as a carrier for the inorganic phases and provides the rheology necessary for screen printing. Dispersing agents and rheological additives may be added in small quantities to adjust viscosity, printability and shelf life.

The thickness of the dried film after baking to remove the solvent at about 150° C. is between about 5 to 50 micrometers and after the firing of the film at a temperature above the softening temperature of the glass frit of about 500° to 850° C. the resulting thickness is between about 2 to 25 micrometers. The organic resin is removed during the firing step and the glass frit is coalesced or fused as the permanent binder for the conductive metal powder.

Before drying or firing the thick film 24, the ceramic substrate 10 with thick film 24 is placed on a vacuum table 30. Portions of the thick film 24 are pulled through the via holes 20 by means of the vacuum generated by a vacuum pump (not shown) connected to vacuum line 32. The result of this process is shown in FIG. 2. The thick film is dried at about 150° C. for about 10 to 15 minutes, but not fired.

Figure 3:
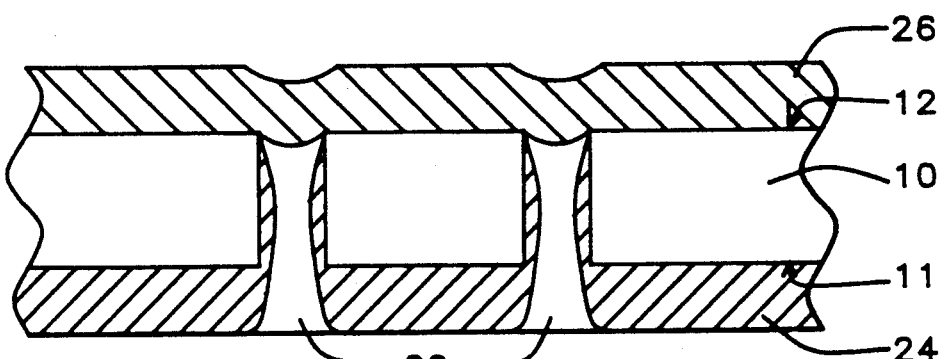

Referring now to FIG. 3, a second thick film 26 is screen printed on the reverse side 12 of the ceramic substrate 10. This will be the circuit side. This second thick film is preferably of copper because of copper's conductivity advantage. The composition of this second thick film is otherwise the same as the previously describes first thick film. The thick film 26 is dried and fired. The thick film 24 is simultaneously fired with the firing of thick film 26. The result of these processes is shown in FIG. 3 wherein the metal 24 within the vias 20 has contracted during the drying and firing of the thick film layers. The surface of the metal layers 24 and 26 is rough and nonuniform from a microscopic viewpoint, although this is not specifically shown.

Figure 4:
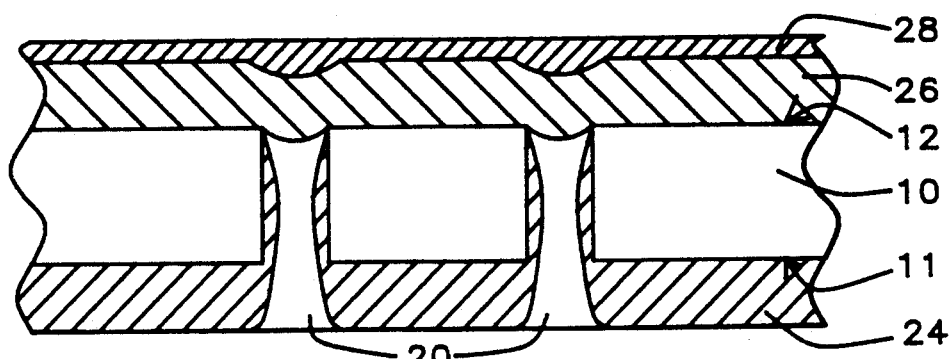

Referring now to FIG. 4, a metallorganic conductive paste 28 is screen printed on top of the thick film 26. This metallorganic paste 28 is composed of base metal resinates, noble metal resinates and organic modifiers. Metal resinates are produced by chemically reacting or complexing a long-chain organic molecule with a metal salt. Metallorganics are extensions of pure metal resinates. Specific base metal resinates may be added to noble metal resinates to promote adhesion, reflectance and wear resistance. Organic modifiers are used to alter the rheology of the metallic solution. Metallorganics of gold, platinum, silver and alloys of these, or with palladium and rhodium are available in volume. Formulated metallorganics generally contain between 2 to 30% noble metal. Drying and firing are similar to thick film paste processes. Depending upon the substrate the firings are between about 500° to 850° C. or more. The resulting thickness of the metallorganic film of the fired process is between about 0.3 to 0.5 micrometers.

If the printed circuit covers the whole substrate, the metallorganic paste is screen printed over the whole substrate. However, if the printed circuit covers portions of the substrate, the metallorganic paste is screen printed only over those portions. The metallorganic paste 28 may be gold, platinum, palladium, copper, mixtures thereof or similar noble metals. These metals are very stable and allow a minimum of surface corrosion. These metals are very expensive, but whereas conventional thick film contains 80-90% noble metal, metallorganics contain generally 20% noble metal. An example of a gold metallorganic is 25% of (gold amine - 98.5%, Rh-ethylhexoate - 0.1%, and Bi-ethylhexoate - 1.4%) and 75% xylene solvent.

The metallorganic paste 28 is dried and fired. The resulting structure is shown in FIG. 4.

If the linewidth of the desired circuits is less than 4 mils, then the circuits are defined by photolithography. If the desired linewidth is greater than 4 mils, the screen printing technology is sufficient to define the circuits.

The described embodiment of FIGS. 1 through 4 describes the formation of via holes and a ground plane on the reverse side of the microwave circuit side of the substrate. Where the ground plane is not needed, the formation of the layer 24 and even the via holes 20 can be eliminated.

A further important embodiment having additional advantages, involves using different metals in the thick and thin layer 26 and 28, respectfully. The thick film 26 will be made of copper conductive material and the thin film 28 will be made of either gold, platinum or a mixture thereof. The advantage of this combination is to give high conductivity from the copper while eliminating the copper corrosion problem with the covering layer of gold, platinum or a mixture thereof. The ground plane can be either silver or copper, but silver is preferred to overcome the corrosion problem of copper.

The process of the invention results in the manufacture of a microwave circuit that combines the lower production costs, lower electrical line resistance, and good adhesion between conductor and substrate of thick film processing with the smaller conductor size, good surface roughness, lower electrical transmission loss, good thickness uniformity, and higher circuit density of thin film processing.

While the invention has been particularly shown and described with reference to the preferred embodiments thereof, it will be understood by those skilled in the art that various changes in form and details may be made without departing from the spirit and scope of the invention.

What is claimed is:

1. The method of metallization of a microwave circuit on a substrate to produce a single, highly conductive layer comprising:

screen printing a thick film paste on said substrate of said microwave circuit;

drying and firing said thick film paste to form a conductive thick film layer;

screen printing metallorganic conductive noble metal paste on the top surface of said conductive thick film layer; drying and firing said metallorganic conductive paste to form a metallorganic conductive layer and to complete the formation of said microwave circuit and wherein said thick film layer and metallorganic conductive layer include different metals and the thickness of said conductive thick film layer is between about 2 to 25 micrometers and the thickness of said metallorganic conductive layer is between about 0.3 to 0.5 micrometers.

2. The method of claim 1 wherein said substrate is composed of a ceramic, said thick film paste consists of a glass frit and noble metal powder, and said firing of said thick film paste is at a temperature of between about 500° to 850° C.

3. The method of claim 1 wherein said conductive thick film layer is copper.

4. The method of claim 3 wherein said metallorganic layer is gold.

5. The method of claim 3 wherein said metallorganic layer is platinum.

6. The method of claim 1 wherein the linewidth of said single, highly conductive layer is less than 4 mils and further comprising after said drying and firing said metallorganic conductive paste, photolithography and etching to further define said linewidth and to complete the formation of said microwave circuit.

7. The method of claim 1 and further comprising before said screen printing a thick film paste: forming via holes in said substrate, forming a ground plane thick film paste pattern on the substrate side opposite to that of the planned microwave circuit, pulling by vacuum a portion of said ground plane thick film paste into said via holes, drying said ground plane thick film paste and simultaneously firing said ground plane thick film paste with said thick film paste.

8. The method of claim 7 wherein said ground plane thick film paste comprises copper, said thick film paste comprises copper and said metallorganic paste comprises gold.

9. The method of metallization of a microwave circuit on a substrate to produce a single, highly conductive layer on one side of the substrate and a conductive ground plane on the opposite side of the substrate comprising:
   forming via holes through said substrate;
   screen printing a first thick film paste over said ground plane side of said substrate;
   placing said substrate on a vacuum table and pulling portions of said first thick film paste through said via holes by means of a vacuum;
   drying said first thick film paste;
   screen printing a second thick film paste on the reverse side to that of the said ground plane side of said substrate;
   drying said second thick film paste;
   simultaneously firing said first and second thick film paste to form first and second conductive thick films, respectively;
   screen printing metallorganic conductive noble metal paste on the top surface of at least a portion of said second conductive thick film; and
   drying and firing said metallorganic conductive paste to form a conductive metallorganic thin film layer wherein said second thick film layer and metallorganic conductive layer include different metals and the thickness of said conductive thick film layer is between about 2 to 25 micrometers and the thickness of said metallorganic conductive layer is between about 0.3 to 0.5 micrometers; and
   photolithography and etching to further define said single, highly conductive layer composed of said second thick film layer and said metallorganic conductive thin film layer to complete said microwave circuit.

10. The method of claim 9 wherein said second conductive thick film is composed of copper and said conductive metallorganic thin film is composed of gold.

11. The method of claim 10 wherein said first thick film is composed of copper.

12. The method of claim 9 wherein said second conductive thick film is composed of copper and said conductive metallorganic thin film is composed of platinum.

13. The method of claim 9 wherein said via holes are formed by laser drilling.

14. The method of claim 9 wherein said substrate is composed of a ceramic, said thick film paste consists of a glass frit and noble metal powder, and said firing is at a temperature of between about 500° to 850° C.

15. The method of metallization of a microwave circuit on a substrate to produce a single, highly conductive layer on one side of the substrate and a conductive ground plane on the reverse side of the substrate comprising:
   forming via holes through said substrate;
   screen printing a first thick film paste over said ground plane side of said substrate;
   placing said substrate on a vacuum table and pulling portions of said first thick film paste through said via holes by means of a vacuum;
   drying said first thick film paste;
   screen printing a copper thick film paste on the reverse side to that of the said ground plane side of said substrate;
   drying said copper thick film paste;
   simultaneously firing said first and copper thick film paste to form first and copper conductive thick films, respectively;
   screen printing metallorganic conductive noble metal paste on the top surface of at least a portion of said copper conductive thick film; and
   drying and firing said metallorganic conductive paste to form a conductive metallorganic noble metal thin film layer; said thickness of said first and copper conductive thick films is between about 2 to 25 micrometers and the thickness of said metallorganic conductive noble metal thin film is between about 0.3 to 0.5 micrometers; and photolithography and etching to further define said single, highly conductive layer composed of said copper thick film layer and said metallorganic conductive metal thin film layer to complete said microwave circuit.

16. The method of claim 15 wherein said conductive noble metal thin film is gold.

17. The method of claim 15 wherein said first conductive thick film is composed of copper.

* * * * *